(12) United States Patent
Chen

(10) Patent No.: US 11,940,575 B2
(45) Date of Patent: Mar. 26, 2024

(54) MICRO IMAGE DETECTOR

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

(*) Notice: Subject to any disclaimer, the term of this patent is extended or adjusted under 35 U.S.C. 154(b) by 10 days.

(21) Appl. No.: 17/872,661

(22) Filed: Jul. 25, 2022

(65) Prior Publication Data
US 2023/0032758 A1  Feb. 2, 2023

Related U.S. Application Data

(60) Provisional application No. 63/226,014, filed on Jul. 27, 2021.

(51) Int. Cl.
*G01T 1/20* (2006.01)
*G01T 1/202* (2006.01)

(52) U.S. Cl.
CPC ............ *G01T 1/2018* (2013.01); *G01T 1/202* (2013.01)

(58) Field of Classification Search
None
See application file for complete search history.

(56) References Cited

U.S. PATENT DOCUMENTS

2004/0136493 A1\* 7/2004 Konno ................ G01T 1/20182
378/19

\* cited by examiner

*Primary Examiner* — Edwin C Gunberg
(74) *Attorney, Agent, or Firm* — Muncy, Geissler, Olds & Lowe, P.C.

(57) ABSTRACT

An image detector includes a substrate, a circuit layer, a plurality of light detecting elements, a plurality of driving elements and a crystal scintillation layer. The substrate has a surface. The circuit layer is arranged on the surface of the substrate, and defines a plurality of detecting areas arranged in an array. The light detecting elements and the driving elements are disposed at the detecting areas and electrically connected with the circuit layer. Each driving element drives one or more of the light detecting elements. The crystal scintillation layer is arranged opposite to the substrate and covers the detecting areas. The light detecting elements and the driving elements connect with the surface of the substrate. At least one of the light detecting elements and the driving elements is formed by a process different from the process of forming the circuit layer on the substrate.

17 Claims, 5 Drawing Sheets

MICRO IMAGE DETECTOR

CROSS REFERENCE TO RELATED APPLICATIONS

The non-provisional patent application claims priority to U.S. provisional patent application with Ser. No. 63/226,014 filed on Jul. 27, 2021. This and all other extrinsic materials discussed herein are incorporated by reference in their entirety.

BACKGROUND

Technology Field

The present disclosure relates to a detector and, in particular, to an image detector capable of detecting X-ray.

Description of Related Art

In the traditional X-ray imaging technology, imaging film is exposed to X-ray and thus forming image. In recent years, due to the development of semiconductor technology, the X-ray imaging technology has also evolved to use the flat-type digital image sensitive plate for obtaining image, A.K.A digital radiography (DR) technology.

SUMMARY

Embodiments of the present invention are directed to an image detector being beneficial of, compared with the conventional X-ray imaging device, providing high resolution and fast operation speed, and further providing the manufacturing process and product with low cost and high application flexibility.

Embodiments of the present invention provide an image detector, which includes a substrate, a circuit layer, a plurality of light detecting elements, a plurality of driving elements and a crystal scintillation layer. The substrate has a surface, and the circuit layer is arranged on the surface of the substrate. The circuit layer defines a plurality of detecting areas arranged in an array. The light detecting elements and the driving elements are disposed at the detecting areas and electrically connected with the circuit layer. Each driving element drives one or more of the light detecting elements. The crystal scintillation layer is arranged opposite to the substrate and covers the detecting areas. The light detecting elements and the driving elements connect with the surface of the substrate, and at least one of the light detecting elements and the driving elements is formed by a process different from the process of forming the circuit layer on the substrate.

In one embodiment, the substrate is a rigid substrate or a resilient substrate.

In one embodiment, the width of each detecting area is equal to or less than 70 μm.

In one embodiment, each light detecting element is a III-V compound light sensor, a II-VI compound light sensor, or a silicon-based light sensor.

In one embodiment, each driving element is a thin-film transistor (TFT) or a micro integrated circuit (Micro-IC).

In one embodiment, the driving elements are transferred to the detecting areas by a mass transfer process, and the light detecting elements and the circuit layer are formed on the surface of the substrate by the same process.

In one embodiment, the driving elements are transferred to the detecting areas by a mass transfer process, and the light detecting elements are transferred to the detecting areas by a mass transfer process.

In one embodiment, the light detecting element and the driving element in each of the light detecting areas are independent from each other.

In one embodiment, the driving elements and the circuit layer are formed on the surface of the substrate by the same process, and the light detecting elements are transferred to the detecting areas by a mass transfer process.

In one embodiment, each of the light detecting elements and a corresponding one of the driving elements are integrated as one independent component so as to obtain a plurality of the independent components.

In one embodiment, the independent components are transferred to the surface of the substrate by a mass transfer process.

As mentioned above, the image detector of this disclosure has the advantages of, compared with the conventional X-ray imaging device, providing high resolution and fast operation speed, and further providing the manufacturing process and product with low cost and high application flexibility.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1:
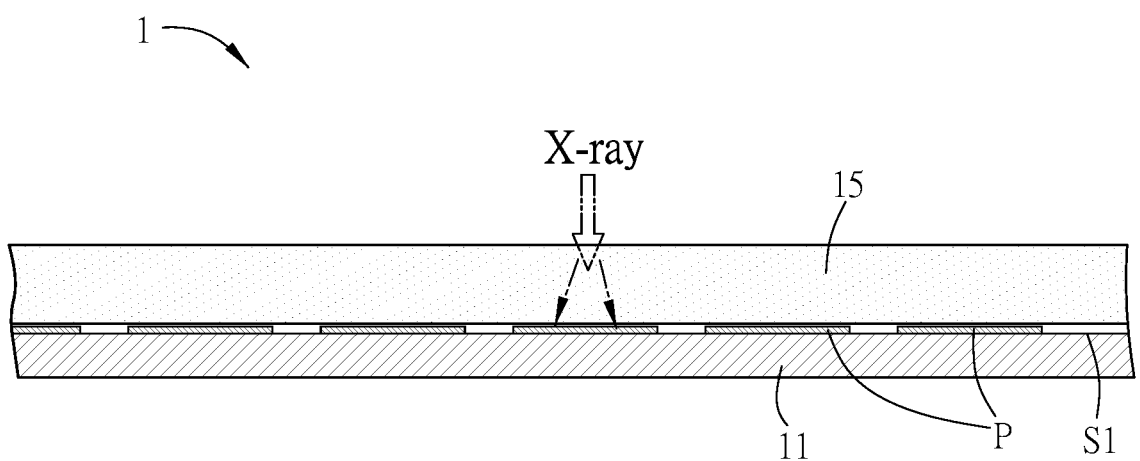
FIG. 1 is a schematic diagram showing an image detector according to an embodiment of this disclosure.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Figure 2:
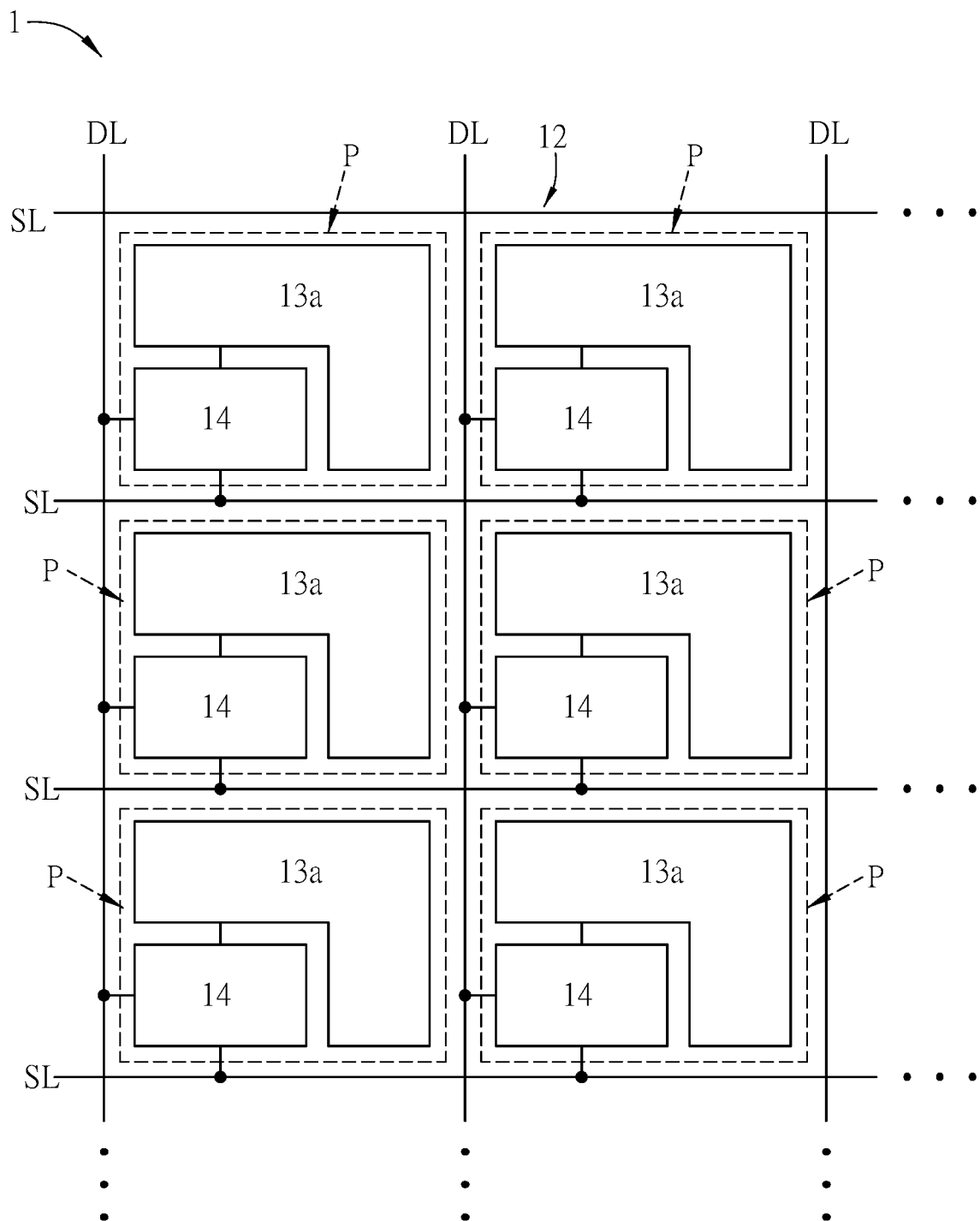
FIG. 2 is a schematic top view showing the configuration of the image detector according to an embodiment of this disclosure.
Figure 3A:
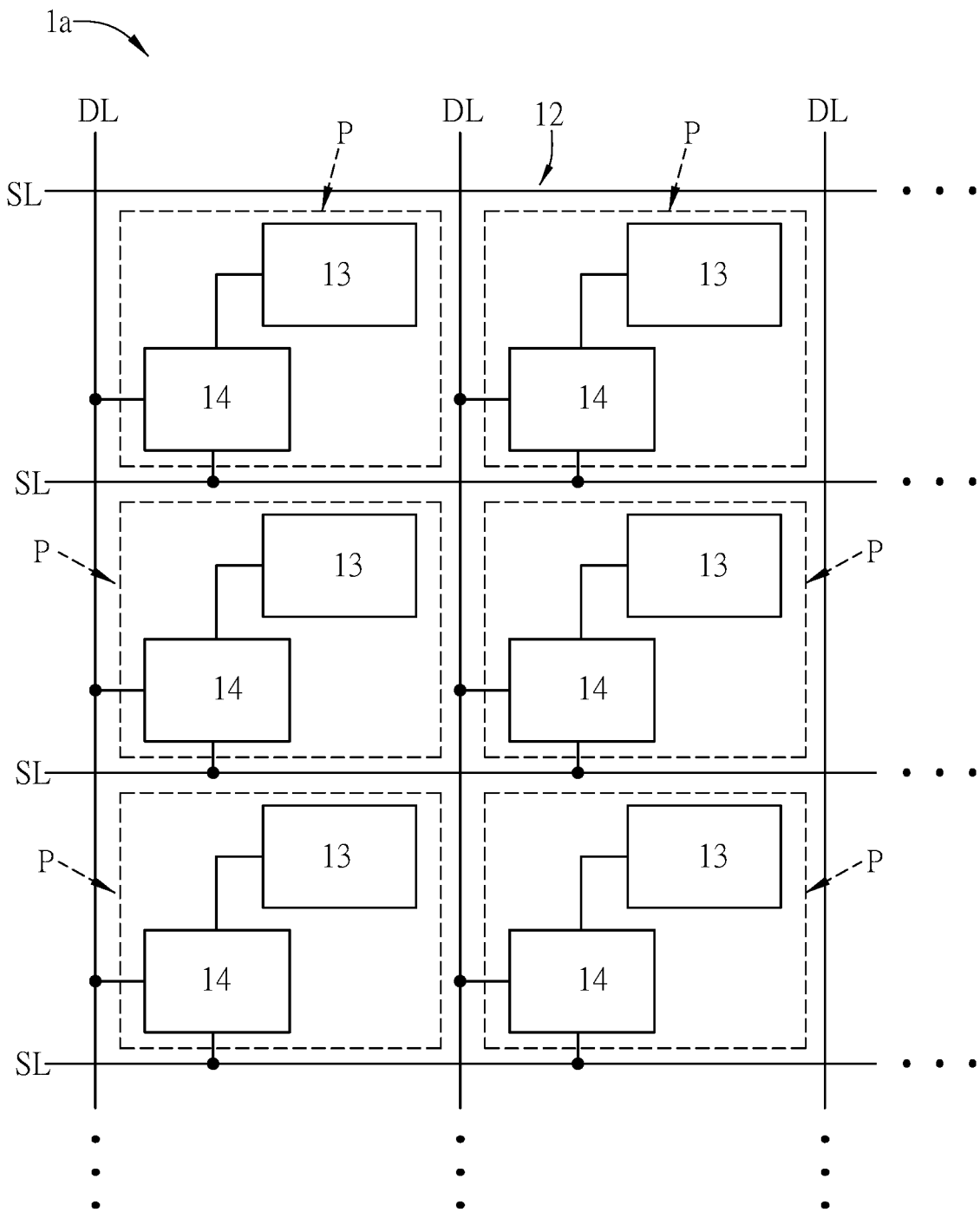
FIGS. 3A to 3C are schematic top views showing the configurations of the image detectors according to different embodiments of this disclosure.
Figure 3B:
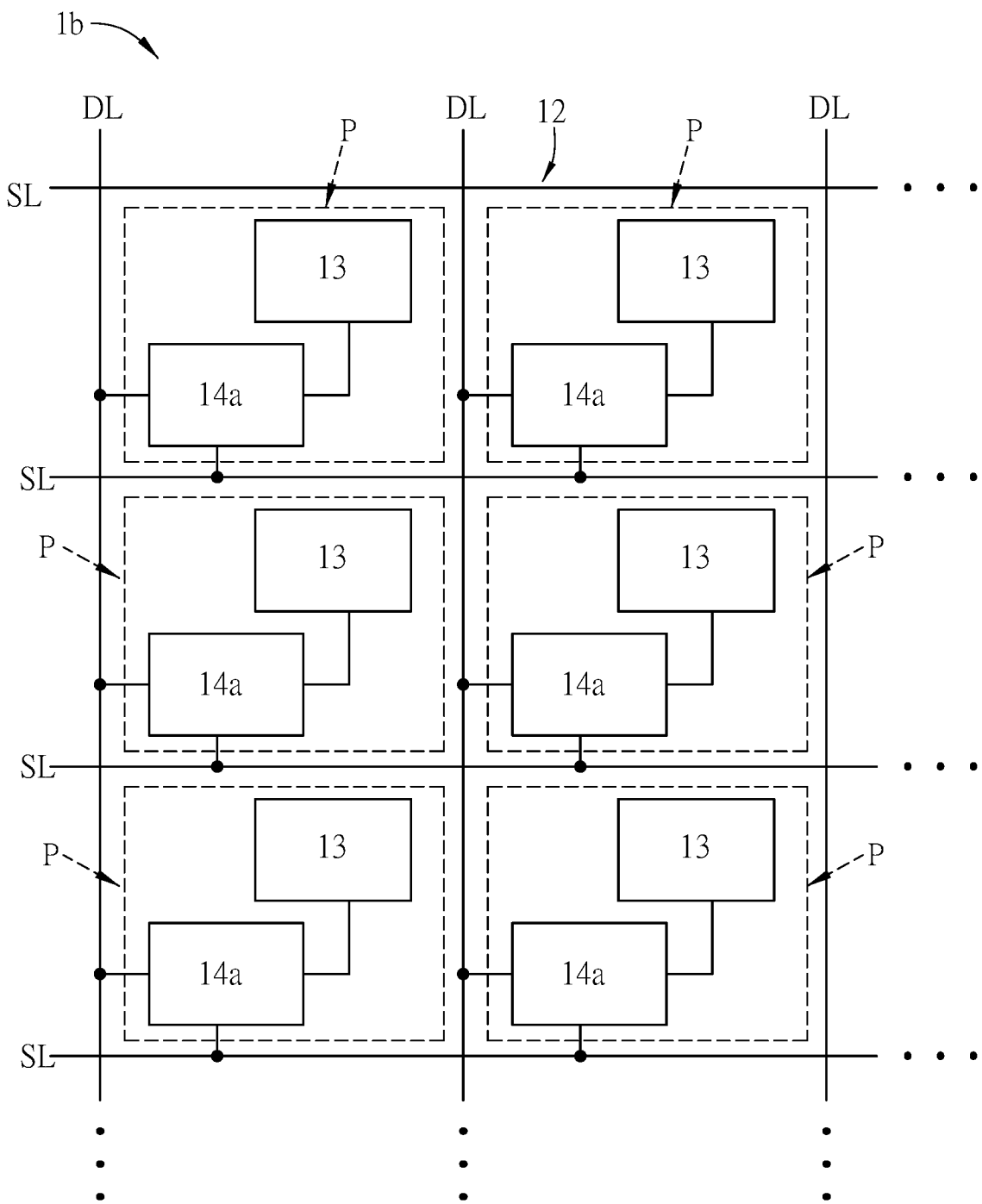
Figure 3C:
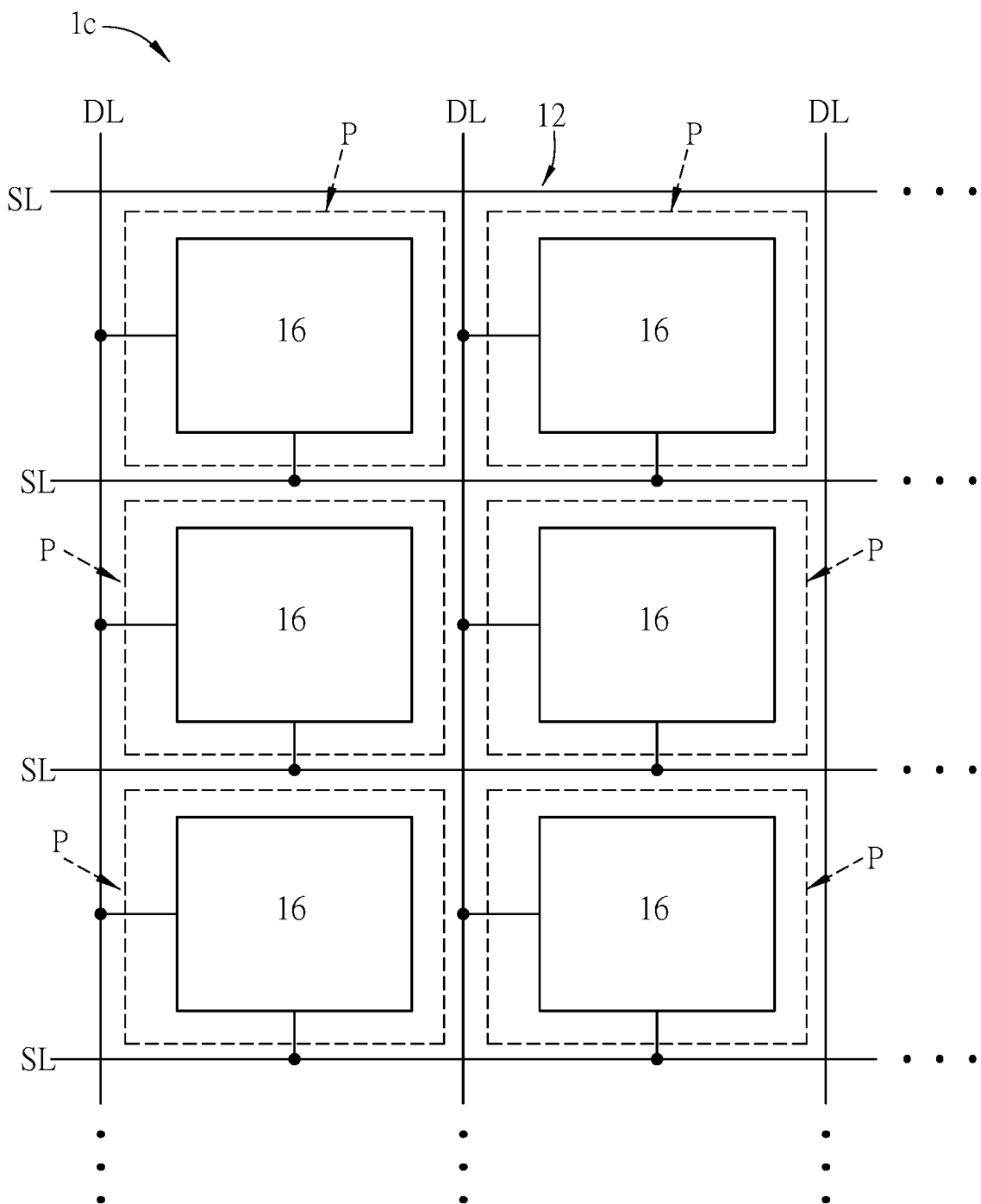

FIG. 1 is a schematic diagram showing an image detector according to an embodiment of this disclosure, FIG. 2 is a schematic top view showing the configuration of the image detector according to an embodiment of this disclosure, and FIGS. 3A to 3C are schematic top views showing the configurations of the image detectors according to different embodiments of this disclosure. To be noted, FIG. 1 does not show the specific components, such as the circuit layer, the light detecting elements and the driving elements, of the image detector, and FIGS. 2 and 3A to 3C do not show the substrate and the crystal scintillation layer of the image detector.

Referring to FIGS. 1 and 2, the image detector 1 of this embodiment includes a substrate 11, a circuit layer 12, a plurality of light detecting elements 13a, a plurality of driving elements 14, and a crystal scintillation layer 15.

The substrate 11 has a surface S1. In some embodiments, the substrate 11 can be a rigid substrate, a resilient substrate, or a composite substrate containing a rigid substrate and a resilient substrate. For example, the substrate 11 can be a glass substrate, a polytetrafluoroethylene (PTFE) substrate, a ceramic substrate, a polyimide (PI) substrate, a metal-glass fiber composite plate, a metal-ceramic composite plate, or a composite substrate including at least one of the foregoing materials. In this embodiment, the substrate 11 is a glass substrate.

The circuit layer 12 is arranged on the surface S1 of the substrate 11. In this case, the circuit layer 12 is a general term, and any of the films or layers formed on the substrate 11, for example, by a thin-film process, such as a conductive layer for transmitting electrical signals (e.g. scanning lines, signal reading lines, etc.), a conductive layer for transmitting power (e.g. traces for transmitting working voltage, traces for grounding, etc.), an insulating layer, or the likes, can be referred to as the circuit layer 12. The above-mentioned thin-film process can include the semiconductor manufacturing process, which comprises an amorphous silicon (α-Si) process, a low-temperature polycrystalline silicon (LTPS) process, a high-temperature polycrystalline silicon (HTPS) process, a low-temperature polysilicon oxide (LTPO) process, a high-temperature polysilicon oxide (HTPO) process, or a metal oxide semiconductor process (e.g. IGZO), and this disclosure is not limited.

In this embodiment, the circuit layer 12 at least defines a plurality of detecting areas P arranged in an array. As shown in FIG. 2, the circuit layer 12 of this embodiment includes a plurality of scan lines SL laterally arranged in parallel and a plurality of data lines DL vertically arranged in parallel. The scan lines SL are interposed with the data lines DL to define the detecting areas P, and the detecting areas P are configured to accommodate the light detecting elements 13a and the driving elements 14. In some embodiments, the width of each detecting area P is equal to or less than 70 μm (i.e. width≤70 μm), so that the image detector 1 can achieve an extremely high resolution. The material of the circuit layer 12 can include, for example, gold, copper, aluminum, or any combination thereof, or an alloy including any combination thereof, or any of other conductive materials.

The light detecting elements 13a are disposed at the detecting areas P and electrically connected with the circuit layer 12. The driving elements 14 are disposed at the detecting areas P and electrically connected with the circuit layer 12. Specifically, the light detecting elements 13a and the driving elements 14 are connected with and arranged on/above the surface S1 of the substrate 11, and each driving element 14 is configured to drive one or more of the light detecting elements 13a. In this embodiment, each detecting area P is configured with one driving element 14 and one light detecting element 13a (arranged in a one-on-on manner), and each driving element 14 drives the corresponding light detecting element 13a on the same detecting area P. To be noted, this disclosure is not limited to the above arrangement. In other embodiments, one driving element 14 can drive more than one light detecting elements 13a.

In some embodiments, each light detecting element 13a can be, for example but not limited to, a III-V compound light sensor, a II-VI compound light sensor, or a silicon-based light sensor. In some embodiments, each driving element 14 can be, for example but not limited to, a thin-film transistor (TFT) or a micro integrated circuit (Micro-IC).

The crystal scintillation layer 15 is facing the surface S1 and is thus arranged opposite to the substrate 11. The crystal scintillation layer 15 at least covers the detecting areas P. In this embodiment, the crystal scintillation layer 15 can be made of a partial pixelated scintillator layer, which includes a plurality of scintillators. The scintillators can be organic scintillators, inorganic scintillators, or gas scintillators. In one embodiment, the material of the crystal scintillation layer 15 can include, for example but not limited to, gadolinium oxide sulfur (GOS ($Gd_2O_2S$)), which can convert the X-ray into visible light. In one embodiment, the maximum thickness of the crystal scintillation layer 15 can be, for example, 300 μm.

As shown in FIG. 1, when the X-ray enters the crystal scintillation layer 15 from the upper side of the crystal scintillation layer 15, the scintillators of the crystal scintillation layer 15 can convert the X-ray into a visible light, which can be detected and received by the light detecting elements 13a on the detecting areas P. When the visible light enters the light detecting elements 13a, the light detecting elements 13a can be excited to generate electron-hole pairs, thereby generating currents (light-sensing signal). Therefore, when the scanning lines SL receive a turn-on signal in sequence, the driving elements 14 connected thereto can be sequentially enabled to read out the light-sensing signals from the light detecting elements 13a through the data reading lines DL, thereby generating an image signal.

Particularly, in the embodiments of this disclosure, the light detecting element "13a" indicates the light detecting element fabricated by, for example, a thin-film process (e.g., as shown in FIG. 2), and the light detecting element "13" indicates an independent and individual light detecting element fabricated by a process other than the thin-film process (e.g., as shown in FIGS. 3A and 3B). In addition, the driving element "14a" indicates a driving element fabricated by a thin-film process (e.g. a TFT as shown in FIG. 3B), and the driving element "14" indicates an independent and individual driving element fabricated by a process other than the thin-film process (e.g. a Micro-IC as shown in FIGS. 2 and 3A). Moreover, in the present disclosure, if a component A and a component B are fabricated or arranged on the substrate by "the same process", it means that the component A and the component B are "integrated" on the substrate; if a component A and a component B are fabricated or arranged on the substrate by "different processes", it means that the component A and the component B are "not integrated" on the substrate.

Therefore, in this disclosure, "at least one of the light detecting elements and the driving elements is formed by a process different from the process of forming the circuit layer 12 on the substrate 11" means that "on the substrate 11, either one or both of the light detecting elements and the driving elements are not integrated with the circuit layer 12". In other words, the process of arranging the light detecting elements or the driving elements on the substrate 11 is different from the process of arranging the circuit layer 12 on the substrate 11. That is, on the substrate 11, the light detecting elements are not integrated with the circuit layer 12; or, on the substrate 11, the driving elements are not integrated with the circuit layer 12; or, the process of arranging the light detecting elements on the substrate 11 and the process of arranging the driving elements on the substrate 11 are the different from that of the circuit layer 12 (i.e., neither the light detecting elements nor the driving elements are integrated with the circuit layer 12 on the substrate 11).

Specifically, in the embodiment of FIG. 2, the light detecting elements 13a and the circuit layer 12 are fabricated together on the surface S1 of the substrate 11 by the same process (e.g. thin-film process) (i.e., the light detecting elements 13a and circuit layer 12 are integrated ion the surface S1 of the substrate 11). Each driving element 14 is, for example, a Micro-IC, which is an independent component fabricated by another process different from the above-mentioned thin-film process, and then the driving elements 14 are transferred to the detecting areas P by a mass transfer process for disposing on and connecting to the surface S1 of the substrate 11. In more details, the circuit layer 12 and the light detecting elements 13a (e.g. photodiodes) can be formed on the surface S1 of the substrate 11 by a thin-film process, and then the drive members 14 (e.g. Micro-IC), which are independent and individual components, are transferred to the detecting areas P by a mass transfer process, thereby obtaining the image detector 1.

FIG. 3A is a schematic top view showing the configuration of an image detector 1a according to another embodiment of this disclosure. The component configurations and connections of the image detector 1a are mostly the same as those of the image detector 1 of the previous embodiment. Unlike the image detector 1 of the previous embodiment, in the image detector 1a of this embodiment, the light detecting elements 13 and the driving elements 14 on the detecting areas P are individual and independent components, and they are not integrated with the circuit layer on the substrate 11. In this case, each driving element 14 is, for example, a Micro-IC, and each light detecting element 13 is, for example, a Micro-photodetector or a photodiode. The driving elements 14 and the light detecting elements 13 are individually and separately fabricated in advance, and then transferred onto the detecting areas P by a mass transfer process, wherein the driving elements 14 and the light detecting elements 13 are disposed on and connected to the surface S1 of the substrate 11. Specifically, the circuit layer 12 is formed on the surface S1 of the substrate 11 by a thin-film process, and then the individual and independent components including the light detecting elements 13 and the driving elements 14 are transferred onto the detecting areas P by a mass transfer process, thereby obtaining the image detector 1a.

FIG. 3B is a schematic top view showing the configuration of an image detector 1b according to another embodiment of this disclosure. The component configurations and connections of the image detector 1b are mostly the same as those of the image detectors of the previous embodiments. Unlike the image detectors of the previous embodiments, in the image detector 1b of this embodiment, the driving element 14a in each detecting area P is a thin-film transistor (TFT), and the driving elements 14a and the circuit layer 12 are fabricated by the same process and formed on the substrate 11. That is, the driving elements 14a and the circuit layer 12 are integrated on the surface S1 of the substrate 11. The light detecting elements 13 are individual and independent components fabricated by the process different from that of the circuit layer 12, and then transferred onto the detecting areas P by a mass transfer process, wherein the light detecting elements 13 are disposed on and connected to the surface S1 of the substrate 11. Specifically, the circuit layer 12 and the driving elements 14a (e.g. TFT) are formed on the surface S1 of the substrate 11 by a thin-film process, and then the individual and independent components including, for example, Micro-photodetectors or photodiodes (i.e. the light detecting elements 13) are transferred onto the detecting areas P by a mass transfer process, thereby obtaining the image detector 1b. Herein, the Micro-photodetectors or photodiodes can be fabricated by any suitable semiconductor material such as, for example but not limited to, Si, GaAs, InGaAs, II-VI compounds, or the like.

FIG. 3C is a schematic top view showing the configuration of an image detector 1c according to another embodiment of this disclosure. The component configurations and connections of the image detector 1c are mostly the same as those of the image detectors of the previous embodiments. Unlike the image detectors of the previous embodiments, in the image detector 1c of this embodiment, each light detecting element and one corresponding driving element are integrated as one independent component so as to obtain a plurality of independent components. Specifically, one light detecting element 13 and one corresponding driving element 14 are integrated as one independent component 16 so as to obtain a plurality of independent components 16. Afterwards, the independent components 16 are transferred onto the surface S1 of the substrate 11 by a mass transfer process. In practice, the circuit layer 12 is formed on the surface S1 of the substrate 11 by a thin-film process, and then the individual and independent Micro-ICs (independent components 16) are transferred onto the detecting areas P of the substrate 11 by a mass transfer process, thereby obtaining the image detector 1c. Herein, each individual and independent Micro-IC is integrated with the functions of the light detecting element 13 and the driving element 14, and it can be fabricated by any suitable semiconductor material such as, for example but not limited to, a-Si, GaAs, InGaAs, II-VI compounds, or the like.

In summary, the image detector of this disclosure has the advantages of, compared with the conventional X-ray imaging device, providing high resolution and fast operation speed, and further providing the manufacturing process and product with low cost and high application flexibility.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A micro image detector, comprising:
a substrate having a surface;
a circuit layer arranged on the surface of the substrate, wherein the circuit layer defines a plurality of detecting areas arranged in an array;

a plurality of light detecting elements disposed at the detecting areas and electrically connected with the circuit layer;
a plurality of driving elements disposed at the detecting areas and electrically connected with the circuit layer, wherein each of the driving elements drives one or more of the light detecting elements; and
a crystal scintillation layer arranged opposite to the substrate and covering the detecting areas;
wherein, the light detecting elements and the driving elements connect with the surface of the substrate, and at least one of the light detecting elements and the driving elements is formed by a process different from a process of forming the circuit layer on the substrate;
wherein the driving elements and the circuit layer are formed on the surface of the substrate by the same process; and
wherein the light detecting elements are transferred to the detecting areas by a mass transfer process.

2. The micro image detector of claim 1, wherein the substrate is a rigid substrate or a resilient substrate.

3. The micro image detector of claim 1, wherein a width of each of the detecting areas is equal to or less than 70 μm.

4. The micro image detector of claim 1, wherein each of the light detecting elements is a III-V compound light sensor, a II-VI compound light sensor, or a silicon-based light sensor.

5. The micro image detector of claim 1, wherein each of the driving elements is a thin-film transistor (TFT) or a micro integrated circuit (Micro-IC).

6. The micro image detector of claim 1, wherein the light detecting element and the driving element in each of the light detecting areas are independent from each other.

7. A micro image detector, comprising:
a substrate having a surface;
a circuit layer arranged on the surface of the substrate, wherein the circuit layer defines a plurality of detecting areas arranged in an array;
a plurality of light detecting elements disposed at the detecting areas and electrically connected with the circuit layer;
a plurality of driving elements disposed at the detecting areas and electrically connected with the circuit layer, wherein each of the driving elements drives one or more of the light detecting elements; and
a crystal scintillation layer arranged opposite to the substrate and covering the detecting areas;
wherein, the light detecting elements and the driving elements connect with the surface of the substrate, and at least one of the light detecting elements and the driving elements is formed by a process different from a process of forming the circuit layer on the substrate;
wherein the light detecting elements and the circuit layer are formed on the surface of the substrate by the same process; and wherein the driving elements are transferred to the detecting areas by a mass transfer process.

8. The micro image detector of claim 7, wherein the substrate is a rigid substrate or a resilient substrate.

9. The micro image detector of claim 7, wherein a width of each of the detecting areas is equal to or less than 70 μm.

10. The micro image detector of claim 7, wherein each of the light detecting elements is a III-V compound light sensor, a II-VI compound light sensor, or a silicon-based light sensor.

11. The micro image detector of claim 7, wherein each of the driving elements is a thin-film transistor (TFT) or a micro integrated circuit (Micro-IC).

12. The micro image detector of claim 7, wherein the light detecting element and the driving element in each of the light detecting areas are independent from each other.

13. A micro image detector, comprising:
a substrate having a surface;
a circuit layer arranged on the surface of the substrate, wherein the circuit layer defines a plurality of detecting areas arranged in an array;
a plurality of light detecting elements disposed at the detecting areas and electrically connected with the circuit layer;
a plurality of driving elements disposed at the detecting areas and electrically connected with the circuit layer, wherein each of the driving elements drives one or more of the light detecting elements; and
a crystal scintillation layer arranged opposite to the substrate and covering the detecting areas;
wherein, the light detecting elements and the driving elements connect with the surface of the substrate, each of the light detecting elements and a corresponding one of the driving elements are integrated as one independent component so as to obtain a plurality of the independent components, and the independent components is formed by a process different from a process of forming the circuit layer on the substrate; and
wherein the independent components are transferred to the detecting areas by a mass transfer process.

14. The micro image detector of claim 13, wherein the substrate is a rigid substrate or a resilient substrate.

15. The micro image detector of claim 13, wherein a width of each of the detecting areas is equal to or less than 70 μm.

16. The micro image detector of claim 13, wherein each of the light detecting elements is a III-V compound light sensor, a II-VI compound light sensor, or a silicon-based light sensor.

17. The micro image detector of claim 13, wherein each of the driving elements is a thin-film transistor (TFT) or a micro integrated circuit (Micro-IC).

* * * * *